(12) United States Patent
Tokuno et al.

(10) Patent No.: US 7,307,430 B2
(45) Date of Patent: Dec. 11, 2007

(54) OPEN OFFSET CANCELING METHOD AND AN IMPEDANCE MEASURING APPARATUS USING THE METHOD

(75) Inventors: Koji Tokuno, Tokyo (JP); Yoichi Kuboyama, Tokyo (JP); Hideki Wakamatsu, Fukuoka (JP)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 11/471,789

(22) Filed: Jun. 21, 2006

(65) Prior Publication Data

US 2007/0024310 A1    Feb. 1, 2007

(30) Foreign Application Priority Data

Jul. 28, 2005   (JP)   ............................. 2005-218426

(51) Int. Cl.
*G01R 27/02* (2006.01)
*G01R 17/10* (2006.01)

(52) U.S. Cl. ...................... 324/610; 324/725

(58) Field of Classification Search ............. 324/610, 324/725

See application file for complete search history.

(56) References Cited

U.S. PATENT DOCUMENTS 6,054,867 A * 4/2000 Wakamatsu ................. 324/650
6,956,380 B2 * 10/2005 Sakiyama .................... 324/610

FOREIGN PATENT DOCUMENTS

JP          2003-279607         10/2003

* cited by examiner

*Primary Examiner*—Walter Benson
*Assistant Examiner*—Amy He

(57) ABSTRACT

A method for finding the impedance of a device under test using an impedance measuring apparatus having a modem-type auto-balancing bridge, two or more measurement signals, each of which has a different phase with respect to the reference signals supplied to the modem inside said auto-balancing bridge, are applied to a device under test; the impedance of this device under test is measured when each of the measurement signals is applied to the device under test; and the impedance of this device under test is found using the above-mentioned phase and the impedance measurement value of each of these measurements.

6 Claims, 2 Drawing Sheets

OPEN OFFSET CANCELING METHOD AND AN IMPEDANCE MEASURING APPARATUS USING THE METHOD

FIELD OF THE INVENTION

The present invention pertains to impedance measurement technology that uses an auto-balancing bridge, and in particular to impedance measurement technology that uses a modem-type auto-balancing bridge.

DISCUSSION OF THE BACKGROUND ART

The auto-balancing bridge method is one method for measuring the impedance used in the newest impedance measuring apparatuses. Measurement circuits that use the auto-balancing bridge method comprise a signal source for applying measurement signals to a device under test; a current-to-voltage converter for converting the current that flows through a DUT to voltage; and a vector ratio detector for measuring the voltage of measurement signals applied to the DUT and the output voltage of the current-to-voltage converter. The current-to-voltage converter that is used is one which is appropriate for the frequency of the measurement signals. Modem-type current-to-voltage converters are used in conventional measuring apparatuses in order to respond to a broad frequency range. It should be noted that modem means a modulation-demodulation system or modulator-demodulator. Modem-type current-to-voltage converters comprise a null detector, an quadrature detector, an integrator, and a vector modulator. Quadrature detector is referred as phase sensitive detector in below. Vector modulator is referred as vector generator in below. An auto-balancing bridge circuit that uses this modem-type current-to-voltage converter is called a modem-type auto-balancing bridge circuit or simply a modem-type auto-balancing bridge. See JP Unexamined Patent Application (Kokai) 2003-279,607 (pages 2 and 3, FIG. 7).

DC offset occurs in the phase sensitive detector and integrator of modem-type current-to-voltage converters. This DC offset is converted to AC by a vector generator, which is described later and produces an error in the impedance measurement values of the device under test. This difference is called open offset because it can be regarded as constant impedance when a device under test is not connected to the impedance measuring apparatus. An object of the present invention is to eliminate or reduce the effect of open offset on measurement values when measuring the impedance of a device under test.

SUMMARY OF THE INVENTION

In order to solve the above-mentioned problems, the present invention uses two or more measurement signals that are different with respect to the local signal used in the detection part of a modem-type auto-balancing bridge and derives the impedance value of a device under test from which the effect of open offset has been eliminated from the impedance value of the device under test when each of the measurement signals has been applied. The first subject of the invention is a method for measuring the impedance of a device under test using an impedance measuring apparatus having a modem-type auto-balancing bridge, this method characterized in that it comprises a first step for applying to this device under test two or more measurement signals, each of which is a different phase with respect to the same local signal inside this modem-type auto-balancing bridge; a second step for measuring the impedance of this device under test when each of these measurement signals is applied to this device under test; and a third step for finding the impedance of this device under test using the impedance measured values and the above-mentioned phase in each of these measurements.

The second subject of the invention is characterized in that by means of the first subject of the invention, these measurement signals applied to this device under test are two signals, each of which has a phase that is the opposite of the other with respect to this local signal.

The third subject of the invention is characterized in that the first or second subject of the invention further comprises a step for measuring the phase of each of the measurement signals with respect to this local signal.

The fourth subject of the invention is an impedance measuring apparatus having a modem-type auto-balancing bridge, this impedance measuring apparatus characterized in that it comprises a signal source for generating two or more measurement signals, each of which has a different phase with respect to the same local signal inside this modem-type auto-balancing bridge and an arithmetic unit for finding the impedance of this device under test using the above-mentioned phase and the impedance measurement value of this device under test when each of these measurement signals is applied to this device under test.

The fifth subject of the invention is characterized in that by means of the fourth subject of the invention, these measurement signals applied to this device under test are two signals, each of which has a phase that is the opposite of the other with respect to this local signal.

The sixth subject of the invention is characterized in that the fourth or fifth subject of the invention further comprises a device for measuring the phase of these measurement signals with respect to this local signal.

The seventh subject of the invention is characterized in that the fourth or sixth subject of the invention further comprises a vector voltmeter for measuring the impedance of this device under test.

By means of the present invention, it is possible to eliminate or reduce the effect of open offset on measurement values and find an impedance value that is closer to the actual value than in the past when the impedance of a device under test is measured using an impedance measuring apparatus having a modem-type auto-balancing bridge.

DETAILED DESCRIPTION OF THE PREFERRED EMBODIMENT

The present invention will now be described while referring to the preferred embodiments shown in the attached drawings.

Figure 1:
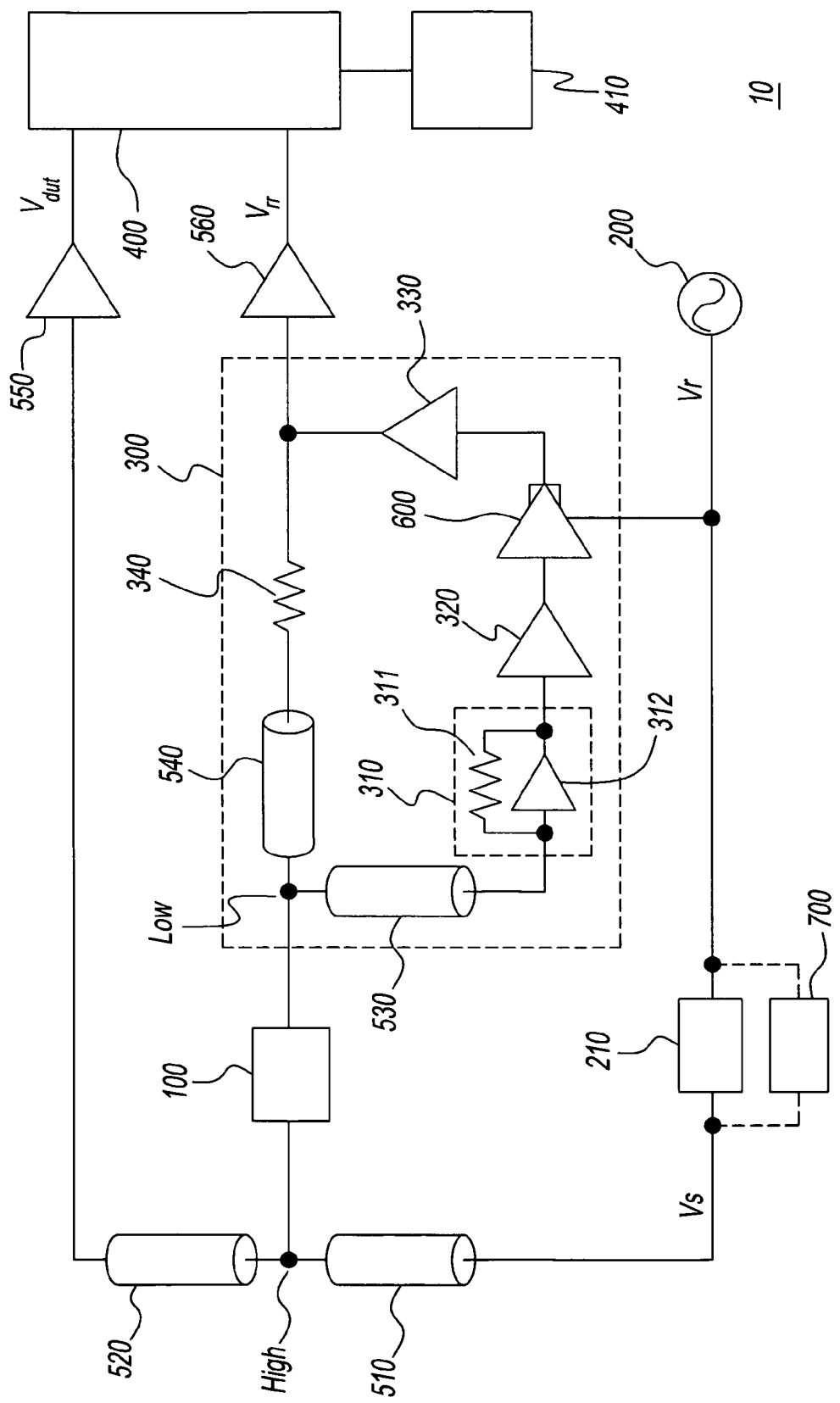
FIG. 1 is a block diagram showing the structure of impedance measuring apparatus 10.

The first embodiment of the present invention is an impedance measuring apparatus 10 based on the auto-balancing bridge method. Refer to FIG. 1. FIG. 1 is a block diagram showing the structure of impedance measuring apparatus 10. Impedance measuring apparatus 10 comprises a signal source 200, a current-to-voltage converter 300, a vector voltmeter 400, and an arithmetic and control unit 410.

A device under test 100 is an element or circuit having two terminals. Device under test 100 should have at least two terminals, and can be an element or circuit having three or more terminals. In this case, two of the three or more terminals are used in the measurements. Device under test 100 is represented as "DUT" in the drawings. The point connecting device under test 100, a cable 510, and a cable 520 is called the high terminal. Moreover, the point connecting device under test 100, a cable 530, and a cable 540 is called the low terminal.

Signal source 200 is the device for generating signals Vr, which are reference signals, and is connected to current-to-voltage converter 300. Moreover, signal source 200 is connected to device under test 100 via a phase shifter 210 and cable 510. Signal source 200 is further connected to vector voltmeter 400 via phase shifter 210, cable 510, cable 520, and a buffer 550. Signals Vr are single sine-wave signals.

Phase shifter 210 is the device for adding delay in a predetermined amount to signals Vr and outputting the results. Output signals Vs of phase shifter 210 are applied to current-to-voltage converter 300. Signals Vs are generally called the measurement signals.

Current-to-voltage converter 300, which is a modem-type current-to-voltage converter, converts the current flowing through device under test 100 and outputs the voltage signals to a buffer 560. Current-to-voltage converter 300 comprises a null detector 310, an alternating-current amplifier 320, a narrow band amplifier 600, a buffer 330, and a range resistor 340. Cable 530, null detector 310, alternating-current amplifier 320, narrow band amplifier 600, buffer 330, range resistor 340, and cable 540 form a negative feedback loop.

Null detector 310 comprises a resistor 311 and an operational amplifier 312, and is the device for converting to voltage the current that flows into the input terminal of null detector 310. Alternating-current amplifier 320 amplifies A-times the output signals of null detector 310 and outputs to narrow band amplifier 600.

Figure 2:
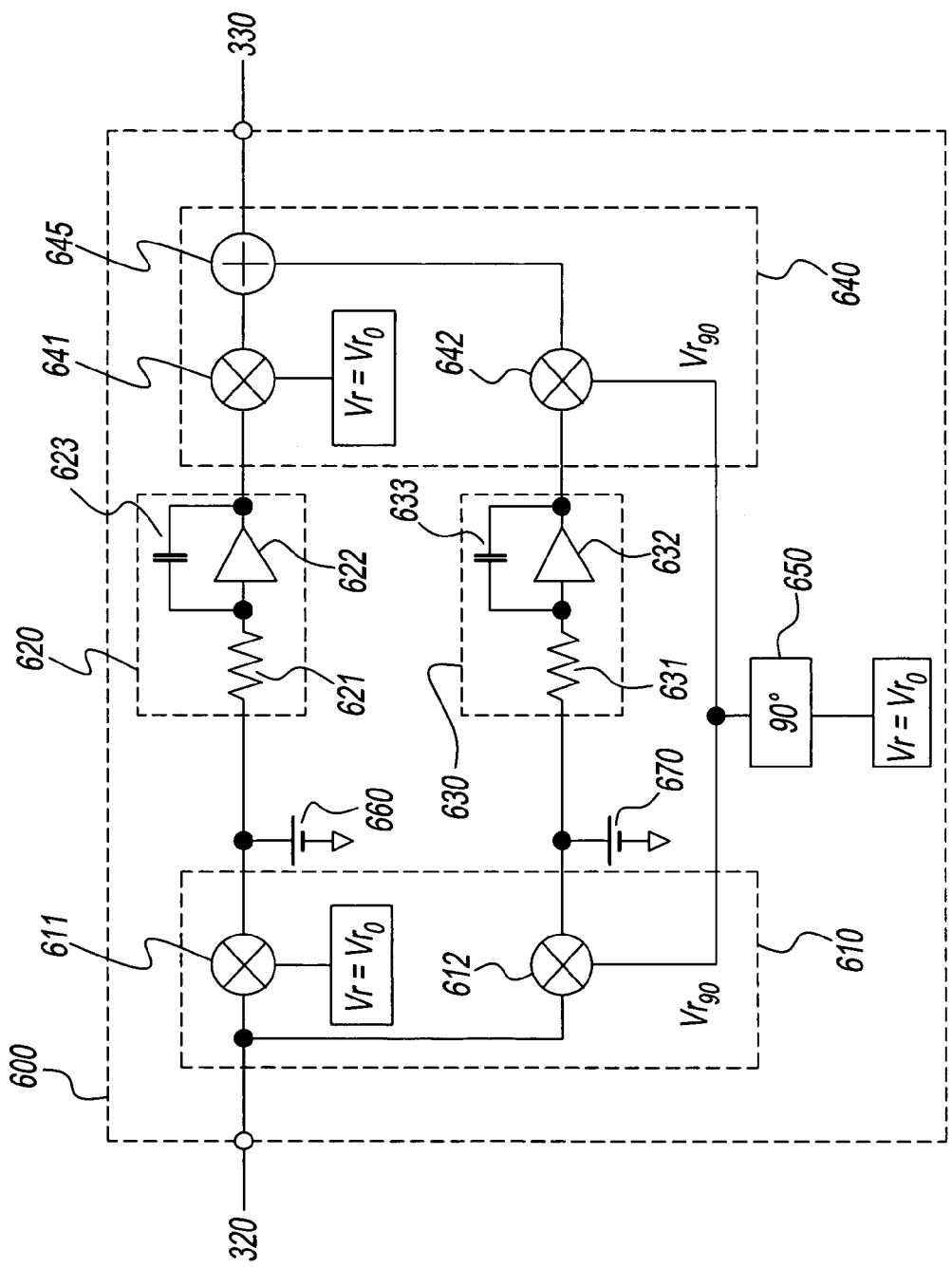
FIG. 2 is a block diagram showing the internal structure of narrow band amplifier 600.

Refer to FIG. 1 and FIG. 2. FIG. 2 is a block diagram showing the internal structure of narrow band amplifier 600. Narrow band amplifier 600 comprises a phase sensitive detector 610, an integrator 620, an integrator 630, a vector generator 640, and a phase shifter 650, and amplifies the output signals of alternating-current amplifier 320 and outputs to a buffer 330. Narrow band amplifier 600 separates the output signals of alternating current amplifier 320 into an in-phase component and a quadrature component using phase sensitive detector 610. The resulting in-phase component and orthogonal component obtained at this time are direct current. Furthermore, the in-phase component is amplified by integrator 620, while the quadrature component is amplified by integrator 630, and the amplified in-phase component and quadrature component are modulated by vector generator 640 and vector modulation voltage signals are fed to buffer 330. As is clear from the drawing, this narrow band amplifier 600 comprises a demodulating part and a modulating part. This is why current-to-voltage converter 300 is called a modem-type IV converter.

Phase sensitive detector 610 comprises a mixer 611 and a mixer 612. Signals Vr are fed to mixer 611 as local signals for demodulation. Phase shifter 650 is the device for shifting by 90° and outputting the phase of signals Vr that will be input. Here, signals Vr are local signals $Vr_0$ and the output signals of phase shifter 650 are local signals $Vr_{90}$. Signals $Vr_{90}$ are fed to mixer 612 as local signals for demodulation.

Signals $Vr_0$ and $Vr_{90}$ have the same frequency and are orthogonal to one another. Consequently, mixers 611 and 612 are capable of orthogonal decomposition of output signals from alternating-current amplifier 320 into an in-phase component and an orthogonal component.

Integrator 620 is an integrator comprising a resistor 621, an operational amplifier 622, and a capacitor 623, and integrates the output signals of mixer 611. Integrators 620 and 630 have the same structure and mode of operation as a low-pass filter, but the primary objective of integrators 620 and 630 here is to amplify the direct-current component to an infinite quantity.

Vector generator 640 comprises a mixer 641, a mixer 642, and an adder 645. Signals $Vr_0$ are fed to mixer 641 as local signals for modulation. Similarly, signals $Vr_{90}$ are fed to mixer 642 as local signals for modulation. Signals $Vr_0$ and signals $Vr_{90}$ have the same frequency and are orthogonal to one another. Mixer 641 modulates signals $Vr_0$ by the output signals from integrator 620 and outputs the result. Mixer 642 modulates signals $Vr_{90}$ by the output signals from integrator 630 and outputs the result. The voltage signals output from mixer 641 and the voltage signals output from mixer 642 are added by adder 645 and output to buffer 330.

Voltage source 660 represents the DC offset $Vn_0$, which is the sum of the DC offset values produced by mixer 611 and by integrator 620. Moreover, a voltage source 670 represents the DC offset $Vn_{90}$, which is the sum of the DC offset values produced by mixer 612 and by integrator 630. There are cases wherein DC offsets $Vn_0$ and $Vn_{90}$ fluctuate with changes in ambient temperature, or the other condition.

Vector voltmeter 400 measures the output signals $V_{dut}$ of buffer 550 and output signals $V_{rr}$ of buffer 560. Arithmetic and control unit 410 consists of a CPU, a DSP, or another processor. It calculates the vector ratio of the measured signals $V_{dut}$ and the measured signals $V_{rr}$ and further calculates the impedance measurement value of device under test 100 from the calculated vector ratio and the resistance of range resistor 340. Moreover, although it is not illustrated, arithmetic and control unit 410 is electrically connected to each structural unit, such as signal source 200 and phase shifter 210, etc, and controls all of impedance measuring apparatus 10.

The measurement error produced by DC offsets $Vn_0$ and $Vn_{90}$ will now be studied. First, $Vr=Vr_0=\sin(\omega t)$. Thus, $Vr_{90}=\cos(\omega t)$ and $Vs=\sin(\omega t+\theta)$. It should be noted that $\theta$ represents the initial phase difference, such as the circuit delay.

Moreover, equivalent input signals $Vn_{ac}$ of DC offsets $Vn_0$ and $Vn_{90}$ are represented as follows: The equivalent input signals $Vn_{ac}$ mean input signals to the narrow-band amplifier 600 to generate DC offsets $Vn_0$ and $Vn_{90}$ in case of assuming that DC offsets $Vn_0$ and $Vn_{90}$ are caused by the input signals at the narrow-band amplifier 600.

$$Vn_{ac} = 2 \cdot \sqrt{Vn_0^2 + Vn_{90}^2} \cdot \sin\left(\omega t + \tan^{-1}\frac{Vn_{90}}{Vn_0}\right)$$ [Mathematical formula 1]

When the resistance of resistor 311 is Rf, the resistance of range resistor 340 is Rr, and the transfer function of narrow band amplifier 600 is H(s), the response Vrrn attributed to signal $Vn_{ac}$ and generated to the output of buffer 560 is represented as follows:

$$Vrrn = Vn_{oc} \cdot \frac{H(s)}{1 + \frac{Rf}{Rr} \cdot A \cdot H(s)} \qquad \text{[Mathematical formula 2]}$$

Here, when $H(s) \gg 1$ and $Rf=Rr$, $Vrrn \approx Vn_{ac}/A$. Furthermore, here, $Vn_{ac}/A = Vn_{ofs} \cdot \sin(\omega t + \theta_{ofs})$. When the impedance of device under test 100 is Yd, the impedance measurement value Ymeas of device under test 100 is represented as follows:

$$Ymeas = Yd - \frac{1}{Vs \cdot Rr \cdot A} \cdot Vn_{ac} \qquad \text{[Mathematical formula 3]}$$

$$= Yd - \frac{1}{Vs \cdot Rr \cdot A} \cdot 2 \cdot \sqrt{Vn_0^2 + Vn_{90}^2} \cdot$$

$$\sin\left(\omega t + \tan^{-1}\frac{Vn_{90}}{Vn_0}\right)$$

$$= Yd - \frac{1}{Vs \cdot Rr} \cdot Vn_{ofs} \cdot \sin(\omega t + \theta_{ofs})$$

All parts other than the Yd term in the terms at the right of the above-mentioned formula represent the offset error attributed to DC offsets $Vn_0$ and $Vn_{90}$. This offset error is also called open offset and is obvious when there is an open connection in place of a device under test. By means of the prior art, a trimmer for offset adjustment is installed at operational amplifier 622, operational amplifier 632, or phase sensitive detector 610 is realized by software processing in order to reduce DC offsets $Vn_0$ and $Vn_{90}$. In such a case, a rise in the interference rate and an increase in cost and occupied surface area with an increase in the number of components become a problem. Moreover, by means of the prior art, the extent of the effect of the error factors on measurement values is reduced by increasing the amplification factor A. In this case, saturation of the phase sensitive detector due to outside noise becomes a problem. In order to reduce the effect of DC offsets $Vn_0$ and $Vn_{90}$ on the measurement values, the present invention applies to device under test 100 two or more measurement signals Vs each having different relative phases with respect to the local signal $Vr_0(=Vr)$ used inside narrow band amplifier 600; separately measures the impedance of device under test 100 when each of the two or more measurement signals Vs are applied to device under test 100; and finds by mathematical operation the impedance Yd of device under test 100 from the resulting multiple measurement values and relative phase values. The theory of canceling the open offset and finding the actual impedance value of device under test 100 by the present invention will now be described.

Two signals $Vs_0$ and $Vs_1$ of different phases with respect to reference signal Vr are applied to device under test 100. When $\alpha_1$ is the phase of signal $Vs_1$ with respect to signal $Vs_0$, $Vs_0 = \sin(\omega t + \theta)$ and $Vs_1 = \sin(\omega t + \theta + \alpha_1)$. Furthermore, $Vs_0$, $Vs_1$, and Vrrn are represented in vector form below. It should be noted that $\alpha_1$ is the amount of phase shift given by phase shifter 210. Moreover, $\alpha_i$ is the relative phase or phase difference between measurement signals.

$$Vs_0 = e^{j\theta} \qquad \text{[Mathematical formula 4]}$$

$$Vs_1 = e^{j(\theta+\alpha_1)}$$

$$Vrrn = Vn_{ofs} \cdot e^{j\theta_o}$$

Moreover, the impedance measurement value $Ymeas_0$ of device under test 100 when $Vs=Vs_0$ and the impedance measurement value $Ymeas_1$ of device under test 100 when $Vs=Vs_1$ are represented as follows:

$$Ymeas_0 = Yd - \frac{1}{Vs_0 \cdot Rr} \cdot Vrrn \qquad \text{[Mathematical formula 5]}$$

$$= Yd - \frac{1}{e^{j\theta} \cdot Rr} \cdot Vn_{ofs} \cdot e^{j\theta_{ofs}}$$

$$Ymeas_1 = Yd - \frac{1}{Vs_1 \cdot Rr} \cdot Vrrn$$

$$= Yd - \frac{1}{e^{j(\theta+\alpha_1)} \cdot Rr} \cdot Vn_{ofs} \cdot e^{j\theta_{ofs}}$$

Furthermore, the impedance value Yx is found by substituting $Ymeas_0$ and $Ymeas_1$ represented by the above-mentioned formula in the following formula. Here, the impedance value Yx is equal to the actual impedance value Yd of device under test 100.

[Mathematical formula 6] \hfill (1)

$$Yx = \frac{Ymeas_0 - e^{j\alpha_1} \cdot Ymeas_1}{1 - e^{j\alpha_1}}$$

Let $\alpha_1$ be $\pi$ as the simplest embodiment. In this case, the measurement signal $Vs_0$ whose relative phase with respect to the local signal $Vr_0$ is 0° is applied to device under test 100 and $V_{dut}$ and $V_{rr}$ at this time are measured by vector voltmeter 400. Moreover, arithmetic and control unit 410 calculates the impedance measurement value $Ymeas_0$ of device under test 100 from the measured values $V_{dut}$ and $V_{rr}$. Next, the measurement signal $Vs_1$ whose relative phase with respect to local signal $Vr_0$ is 180° is applied to device under test 100 and $V_{dut}$ and $V_{rr}$ at this time are measured by vector voltmeter 400. Moreover, arithmetic and control unit 410 calculates the impedance measurement value $Ymeas_1$ of device under test 100 from the measured values $V_{dut}$ and $V_{rr}$. Finally, arithmetic and control unit 410 calculates the impedance value Yd of device under test 100 by $(Ymeas_0 + Ymeas_1)/2$ while referring to measurement values $Ymeas_0$ and $Ymeas_1$, as well as 0° and 180° ($\pi$). When $\alpha_1$ is $\pi$, phase shifter 210 can be substituted by an amplifier capable of positive-negative reversal of the multiplication factor. Of course, it is possible to find Yd from formula (1) and any phase value $\alpha_1$ in cases other than when $\alpha_1$ is $\pi$.

Furthermore, the signals applied to device under test 100 can also be three or more signals, each of which has a different phase with respect to reference signal Vr. For instance, when the signal applied to device under test 100 represents the following n types of signals ($Vs_0$, $Vs_1$, ..., $Vs_n$), Yd is found by the following formula (2). However, $n=2N+1$ and N is a natural number. Moreover, $\theta$ is the relative phase of signal $Vs_0$ with respect to reference signal Vr. Furthermore, $\alpha_i$ is the relative phase of signal $Vs_n$ with respect to reference signal $Vs_0$.

[Mathematical formula 7] \hfill (2)

$$Vs_0 = e^{j\theta}$$

$$Vs_1 = e^{j(\theta+\alpha_1)}$$

$$Vs_2 = e^{j(\theta+\alpha_2)}$$

$$\vdots$$

$$Vs_n = e^{j(\theta+\alpha_n)}$$

-continued

[Mathematical formula 8]

$$Yx = \frac{Ymeas_0 + \sum_{i=1}^{n}[(-1)^i \cdot e^{j\alpha_i} \cdot Ymeas_i]}{1 + \sum_{i=1}^{n}[(-1)^i \cdot e^{j\alpha_i}]}$$

The above-mentioned is an example of a case in which the signals applied to device under test 100 are even numbers, but the present invention, of course, is also applicable to cases in which the signals applied to device under test 100 are odd numbers.

However, if the phase of the measurement signal changes, the auto-balancing bridge will become unstable and a waiting time will be produced wherein the measurement cannot start until the auto-balancing bridge has been adjusted. The adjustment time of the auto-balancing bridge that is produced each time the measurement signals are replaced decreases with a reduction in the phase difference between each of the measurement signals. Moreover, when phase difference $\alpha_i$ in formulas (1) and (2) is biased within one period ($2\pi$) of measurement signals Vs, for instance, when two or three measurement signals wherein the phase difference between the signals is 20° are applied to the device under test, the measurement difference attributed to the phase control error of phase shifter 210 increases. Therefore, the error is reduced by uniformly distributing the phase differences between measurement signals within one period ($2\pi$) of measurement signals Vs and reducing the phase difference by increasing the number of signals, and the settling time is thereby curtailed. Furthermore, 36 measurement signals wherein the phase difference between signals is 10° can be applied to the device under test.

Several modifications relating to the signal source are possible with the present embodiment as long as any one of the local signals used in the modem serves as the reference and two or more measurement signals having a different phase with respect to this reference signal are applied to the device under test. For instance, it is possible to switch signals Vr and signals Vs. That is, it is possible to connect the output of signal source 200 directly to cable 510 and to connect the output of phase shifter 210 to narrow band amplifier 600. In this case, the output signals of signal source 200 become measurement signals Vs, and the output signals of phase shifter 210 become reference signals Vr. Moreover, it is also possible to use separate signal sources to generate signals fed to device under test 100, signals fed to mixer 611, signals fed to mixer 612, signals fed to mixer 641, and signals fed to mixer 642 in FIGS. 1 and 2. However, in this case these signal sources must be synchronized for phase control.

Furthermore, the present embodiment was described using signals $Vr_0$ inside narrow band amplifier 600 as the phase reference of measurement signals Vs, but it is also possible to use signals $Vr_{90}$ inside narrow band amplifier 600 as the phase reference of measurement signals Vs.

In addition, the present embodiment can also be such that $V_{dut}$ is measured by vector voltmeter 400 in order to know the relative phase $\alpha_i$ between signals $Vs_i$. There can also be a relative phase measurement device 700 as shown in FIG. 1. These embodiments are effective in cases in which the phase control precision of phase shifter 210 is poor, and in similar situations.

What is claimed is:

1. A method for measuring the impedance of a device under test using an impedance measuring apparatus having a modem-type auto-balancing bridge, said method comprising:
    applying to said device under test two or more measurement signals, each of which is a different phase with respect to the same local signal inside said modem-type auto-balancing bridge;
    measuring the impedance of said device under test when each of said measurement signals is applied to this device under test; and
    finding the impedance of said device under test using the impedance measured values and said phase in each of said measurements.

2. The method according to claim 1, wherein said measurement signals applied to said device under test are two signals, each of which has a phase that is the opposite of the other with respect to said local signal.

3. The method according to claim 1, further comprising measuring the phase of each of the measurement signals with respect to said local signal.

4. An impedance measuring apparatus having a modem-type auto-balancing bridge, said impedance measuring apparatus comprising:
    a signal source for generating two or more measurement signals, each of which has a different phase with respect to the same local signal inside said modem-type auto-balancing bridge; and
    an arithmetic unit for finding the impedance of said device under test using the above-mentioned phase and the impedance measurement value of said device under test when each of said measurement signals is applied to said device under test.

5. The impedance measuring apparatus according to claim 4, wherein said measurement signals applied to said device under test are two signals, each of which has phase that is the opposite of the other with respect to said local signal.

6. The impedance measuring apparatus according to claim 4, further comprising a device for measuring the phase of said measurement signals with respect to said local signal.

* * * * *